United States Patent
Hsieh et al.

(10) Patent No.: US 8,296,716 B2
(45) Date of Patent: Oct. 23, 2012

(54) METHOD FOR SETTING WIDTH OF TRACE ON PRINTED CIRCUIT BOARD

(75) Inventors: Yi-Hsin Hsieh, Taipei (TW); Yu-Chuan Chang, Taipei (TW); Hui-Ling Chen, Taipei (TW)

(73) Assignee: Inventec Corporation, Taipei (TW)

( * ) Notice: Subject to any disclaimer, the term of this patent is extended or adjusted under 35 U.S.C. 154(b) by 61 days.

(21) Appl. No.: 12/981,424

(22) Filed: Dec. 29, 2010

(65) Prior Publication Data

US 2012/0137266 A1 May 31, 2012

(30) Foreign Application Priority Data

Nov. 30, 2010 (TW) .............................. 99141491 A

(51) Int. Cl.
*G06F 17/50* (2006.01)

(52) U.S. Cl. ........ 716/137; 716/111; 716/118; 716/126; 716/139

(58) Field of Classification Search .................. 716/111, 716/118, 126, 137, 139
See application file for complete search history.

(56) References Cited

U.S. PATENT DOCUMENTS

| | | | |
|---|---|---|---|
| 6,216,258 B1* | 4/2001 | Mohan et al. ................. | 716/117 |
| 6,292,925 B1* | 9/2001 | Dellinger et al. ............. | 716/113 |
| 6,308,302 B1* | 10/2001 | Hathaway et al. ............ | 716/115 |
| 6,412,097 B1* | 6/2002 | Kikuchi et al. ............... | 716/122 |
| 6,510,539 B1* | 1/2003 | Deemie et al. ................ | 716/111 |
| 6,629,302 B2* | 9/2003 | Miura et al. .................. | 716/119 |
| 6,971,082 B2* | 11/2005 | Shiratori ....................... | 716/115 |
| 6,976,236 B1* | 12/2005 | Tain et al. ..................... | 716/126 |
| 7,028,272 B2* | 4/2006 | Mandal et al. ................ | 716/119 |
| 7,168,041 B1* | 1/2007 | Durrill et al. ................. | 715/700 |
| 7,237,219 B2* | 6/2007 | Ikeda et al. ................... | 716/122 |
| 7,240,318 B2* | 7/2007 | Ito et al. ........................ | 716/112 |
| 7,263,682 B2* | 8/2007 | Tsai et al. ..................... | 716/112 |
| 7,281,232 B1* | 10/2007 | Nicolino et al. .............. | 716/112 |
| 7,346,870 B2* | 3/2008 | Du ................................ | 716/112 |
| 7,603,642 B2* | 10/2009 | Subasic et al. ................ | 716/119 |
| 2001/0001881 A1* | 5/2001 | Mohan et al. ..................... | 716/1 |
| 2001/0032222 A1* | 10/2001 | Takahashi et al. ............ | 707/530 |
| 2002/0042904 A1* | 4/2002 | Ito et al. ............................ | 716/8 |
| 2002/0069395 A1* | 6/2002 | Fujiwara et al. .................. | 716/4 |
| 2002/0095643 A1* | 7/2002 | Shiratori ............................ | 716/2 |
| 2008/0046852 A1* | 2/2008 | Bergman Reuter et al. .... | 716/10 |
| 2008/0077898 A1* | 3/2008 | Subasic et al. .................... | 716/9 |
| 2011/0023001 A1* | 1/2011 | Giffel ............................. | 716/122 |

FOREIGN PATENT DOCUMENTS

| | | |
|---|---|---|
| TW | I230348 | 4/2005 |
| TW | 200539763 | 12/2005 |
| TW | 200742517 | 11/2007 |
| TW | I298453 | 7/2008 |

* cited by examiner

*Primary Examiner* — Naum Levin

(74) *Attorney, Agent, or Firm* — CKC & Partners Co., Ltd.

(57) ABSTRACT

A method implemented by a computer layout software for setting the width of the printed circuit board trace is disclosed. The method selects one from several traces set on the printed circuit board traces, obtains the corresponding trace name of the selected trace, obtains the device pin connected to the selected trace, acquires the pad corresponding to the device pin, reads the width of the pad, and adjusts the width of the pad.

8 Claims, 2 Drawing Sheets

METHOD FOR SETTING WIDTH OF TRACE ON PRINTED CIRCUIT BOARD

RELATED APPLICATIONS

This application claims priority to Taiwan Application Serial Number 099141491, filed Nov. 30, 2010, which is herein incorporated by reference.

BACKGROUND

1. Field of Invention

The present invention relates to a trace layout method. More particularly, the present invention relates to a printed circuit board trace layout method.

2. Description of Related Art

In order to make behaviors of modern life more convenient, the current electronic device usually takes a portable form. A printed circuit board which is used to hold the electronic device constituting element needs to be miniaturized, lightened and fined. The printed circuit board is manufactured by way of printing and etching techniques, in which a large number of wires are taken to connect the parts with each other and also serve as the structure supporting the parts.

The wiring on the printed circuit board can be designed manually or automatically by a computer. Computer graphic technique are usually adopted in the process of automatic design. The computer graphic technique implemented on the printed circuit board by the computer mainly includes two stages: a placement operation and a subsequent layout operation. After the printed circuit board placement operation is finished, the subsequent layout operation is performed on the printed circuit board. In the layout operation, the width of the trace is determined according to the manufacturing technology and the required characteristics of an electric apparatus; the width of the trace is also closely related to the allowable current flux.

When the circuit layout engineer layout the traces, both the traces and the pads have different widths, respectfully. If the width of the traces is larger than that of the pads, which usually occurs, the short circuit might be caused. In order to avoid the short circuit situation, the layout engineer needs to search whether the width of the trace is larger than that of the pad and reduces the width of the over-width trace manually after the wiring procedure is substantially finished; otherwise, an additionally manual step is performed to reduce the width of the trace. However, such trace width correction procedure is time-consuming, and the wiring is neither flexible. In addition, the unavoidable human negligence also tends to cause the short circuit among traces and pads.

SUMMARY

According to an embodiment of the present invention, the method for setting the width of the trace on the printed circuit board trace is implemented by a computer layout software which automatically sets the width of the trace on the printed circuit board. The method for setting the width of the trace on the circuit board selects one from a plurality of traces set on the printed circuit board, obtains a corresponding trace name of the selected trace, obtains a device pin connected to the selected trace, acquires a pad corresponding to the device pin, reads a width of the pad, and adjusts the width of the trace based on the width of the pad.

According to another embodiment of the present invention, the method for setting the width of the trace on the printed circuit board trace is implemented by a computer layout software for correcting the width of the trace on the printed circuit board. The method for setting the width of the trace on the printed circuit board opens a nets file, selects one from a plurality of traces when the nets file records these traces, obtains a corresponding trace name of the selected trace, selects at least one device pin connected to the selected trace by using the trace name as an index, acquires a pad corresponding to the device pin from contents recorded by a code file, obtains a width of the pad, determines whether a width of the selected trace is great than that of the pad, and changes the width of the selected trace to be the same as that of the pad when the width of the selected trace is greater than that of the pad.

BRIEF DESCRIPTION OF THE DRAWINGS

In order to make the foregoing as well as other aspects, features, advantages, and embodiments of the present invention more apparent, the accompanying drawings are described as follows.

DESCRIPTION OF THE PREFERRED EMBODIMENTS

A method for setting a width of a trace on a printed circuit board described in the following embodiments can automatically detect whether a width of a trace of a specific printed circuit board is greater than a width of a pad, and can automatically adjust the width of the over-width trace according to the detection result, thus preventing the short circuit situation. Further, the method can prevent correcting the width manually over and over again, thereby improving the wiring efficiency.

Figure 1A:
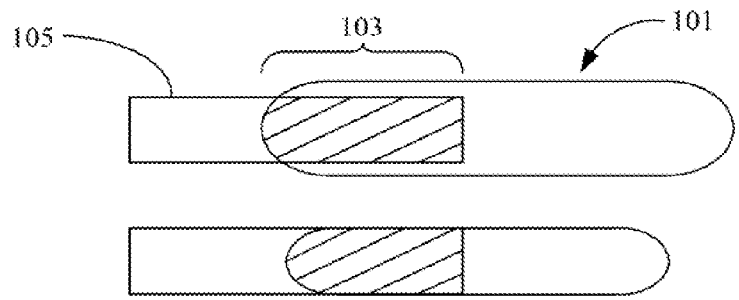
FIG. 1A is a schematic view of a trace according to one embodiment of the present invention.
Figure 1B:
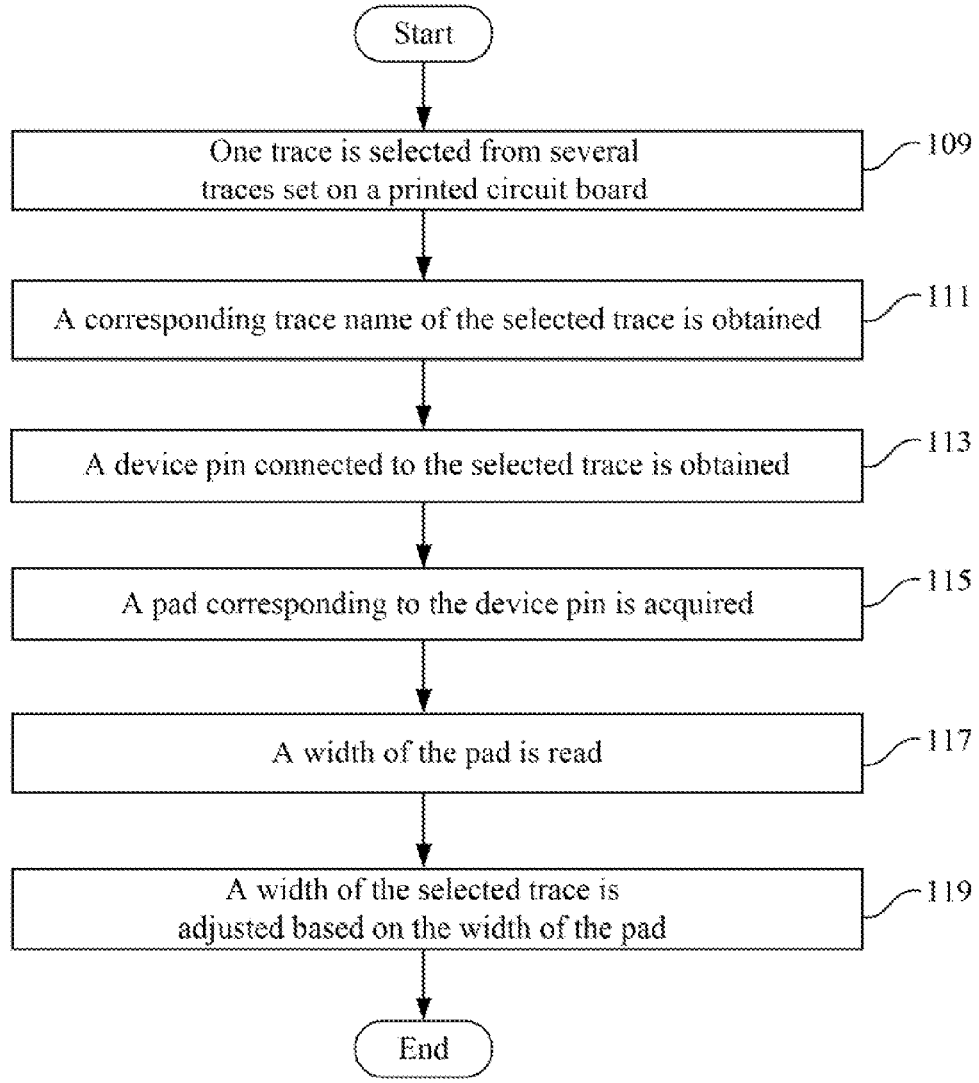
FIG. 1B is a flow chart of a method for setting a width of a trace on a printed circuit board according to one embodiment of the present invention.

Referring to both FIG. 1A and FIG. 1B, these figures are a schematic view of a trace and a flow chart of a method for setting a width of a trace on a printed circuit board trace, respectively, according to one embodiment of the present invention. In general, plural traces 101 are set on the printed circuit board, and each trace 101 can be divided into plural segments 103. These segments 103 require different widths to be respectively connected to several pads 105 with different widths, while the device pins are set on the pads 105. The width of the trace 101 is greater than that of the pad 105 in the upper half of FIG. 1A, so the width of the trace 101 needs to be corrected so that the width of the trace 101 is the same as that of the pad 105, as shown in the lower half of FIG. 1A.

A computer layout software is employed in this embodiment to set the width of the trace on the printed circuit board, in which the computer layout software may be the Computer-Aided Design (CAD) software, such as Mentor, Allegro, etc.

The method for setting the width of the trace on the printed circuit board selects one trace from several traces set on the printed circuit board (step 109) in which the over-width trace can be selected through the manual circling or selected automatically by the computer wiring software. Furthermore, a tack can be added to the trace in first to divide the trace into several segments, and a segment whose width requires changing is selected. Then, a corresponding trace name of the selected trace is obtained (step 111), and a device pin connected to the selected trace is obtained (step 113). More particularly, contents recorded by a nets file can be searched by using the trace name as an index, so as to obtain the device pin connected to the selected trace. After the device pin is obtained, a pad corresponding to the device pin is subsequently acquired (step 115), and a width of the pad is read at the same time (step 117). More specifically, contents recorded by a code file can be searched by using a name of the device pin as an index, so as to acquire the pad corresponding to the device pin and read the width of the pad.

After the width of the pad is read in step 117, the width of a corresponding portion of the trace is adjusted based on the width of the pad (step 119). Particularly, the width of the trace can be reduced so that the width of the trace is the same as that of the pad, and thus a short circuit between the traces and the pads can be prevented. For example, if the pad of an element is narrow and the width of the trace is greater than the width of the pad, then the width of the trace needs to be reduced, such that the trace is not larger than the pad, which avoids the short circuit between the trace and the pad adjacent to it. Since the trace is composed of many segments, the method only changes the width of the segment connected to the pad rather than changes the width of the whole trace.

In this embodiment, the width of the pad connected to the device pin is searched out automatically by a program, and the width of the trace is automatically adjusted to a value complying with the width of the pad. Since the program can automatically derive the width of the pad and properly set the width of the trace, the width of the trace will comply with that of the pad after the program is executed; thus, the operator does not need to change trace width repeatedly.

Figure 2:
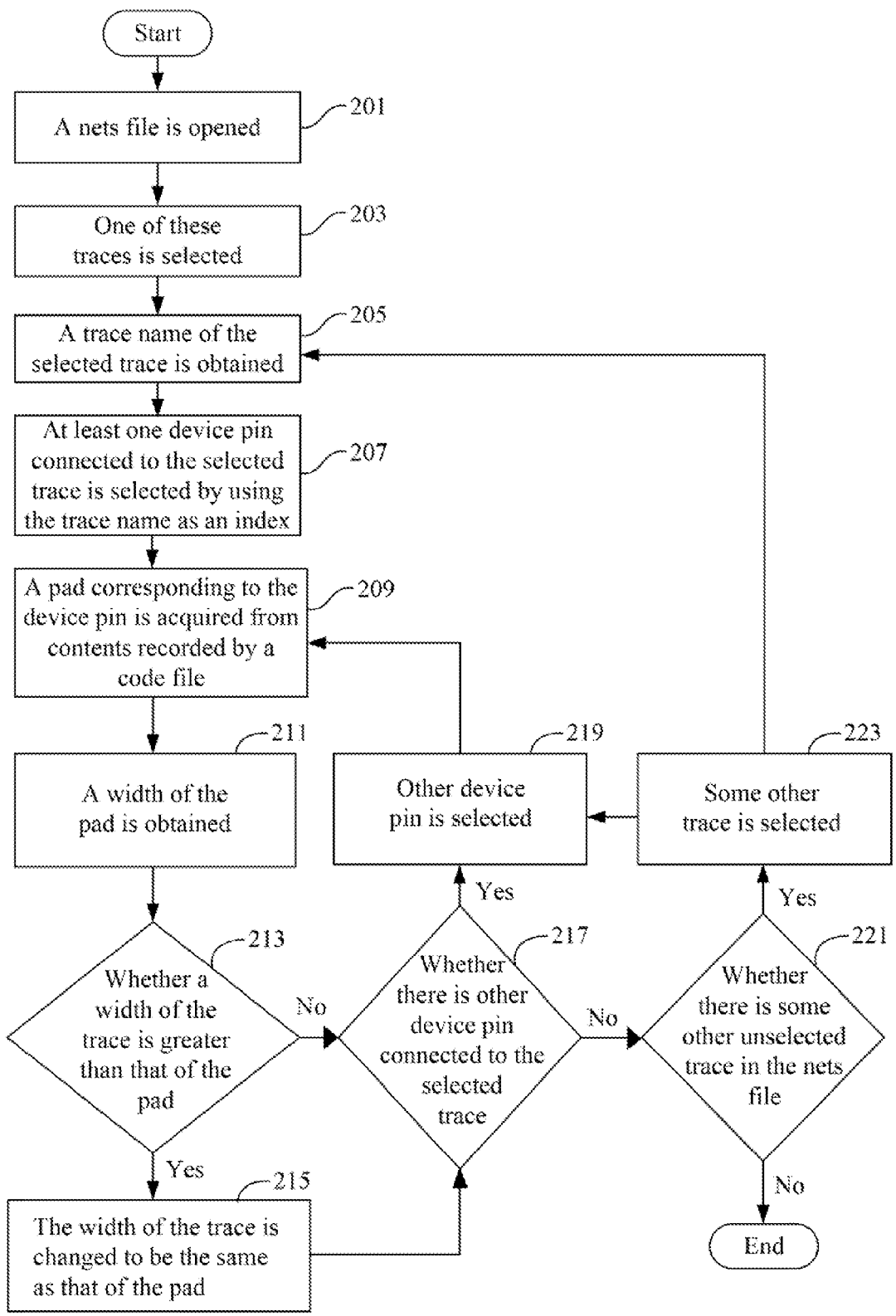
FIG. 2 is a flow chart of a method for setting a width of a trace on a printed circuit board according to another embodiment of the present invention.

FIG. 2 is a flow chart of the method for setting a width of a trace on a printed circuit board trace according to another embodiment of the present invention. The method for setting the width of the trace on the printed circuit board is implemented by a computer layout software for correcting the width of the trace on the printed circuit board. The method for setting the width of the trace on the printed circuit board first opens a nets file (step 201). If several traces are recorded in the nets file, one of these traces is selected (step 203), and more particularly, a pad whose width has not been corrected is selected. A trace name of the selected trace is obtained (step 205). Then, at least one device pin connected to the selected trace is selected by using the trace name as an index (step 207). More particularly, the nets file is searched by using the trace name as an index, so as to select the device pin connected to the selected trace.

After the device pin connected to the selected trace is obtained, a pad corresponding to the device pin is acquired from contents recorded by a code file (step 209), and a width of the pad is obtained (step 211). More particularly, the contents recorded by the code file are read by using a name of the pad as an index, so as to obtain the width of the pad. Then, it is determined whether a width of the trace is greater than that of the pad (step 213). If the width of the trace is greater than that of the pad, the width of the trace is changed to be the same as that of the pad (step 215). At this point, the width of a certain segment of the trace corresponding to a certain pad has been corrected.

Then, it is checked whether there are other device pins connected to the selected trace (step 217). If there are other device pins connected to the selected trace, the other device pins are selected one by one (step 219), then the steps 209 to 215 are repeated to change the width of each segment of the trace, so that the width of each segment of the trace is respectively the same as that of the corresponding pad.

If the widths of the same trace's segments connected to different pads have been corrected in step 217, is the method continues to check whether some other unselected trace exists in the nets file (step 221). When there is the other unselected trace, the other trace is selected (step 223), and the steps (205) to (221) are repeated so that the width of the other trace is the same as that of the corresponding pad.

The above embodiments of the present invention provide a method implemented by a computer layout software for automatically setting a width of a trace on a printed circuit board. In this method, the width of the pad connected to the device pin is searched out automatically by the software, and the width is changed automatically to a value complying with the width of the pad. Then, the search is repeated to check whether there is some other segment or trace whose width has not been changed, until the widths of the trace's segments are all corrected. Since the software can automatically obtain the width of the pad and sets the width of the trace, the widths of all the trace comply with that of the pads after the software, is executed, and thus the repeated width changing is avoided.

Although the present invention has been disclosed with reference to the above embodiments, these embodiments are not intended to limit the present invention. It will be apparent to those skilled in the art that various modifications and variations can be made without departing from the scope or spirit of the present invention. Therefore, the scope of the present invention shall be defined by the appended claims.

What is claimed is:

1. A method for setting a width of a trace on a printed circuit board, implemented by a computer layout software through using a computer, comprising:
   selecting at least one trace from a plurality of traces set on the printed circuit board;
   obtaining a corresponding trace name of the selected trace;
   obtaining a device pin connected to the selected trace;
   acquiring a pad corresponding to the device pin, wherein the device pin is set on the pad;
   reading the width of the pad using the computer; and
   adjusting the width of the selected trace based on the width of the pad, wherein the width of the selected trace is adjusted so that the width of the selected trace is equal to the width of the pad.

2. The method for setting the width of the trace on the printed circuit board as claimed in claim 1, wherein contents recorded by a nets file are searched by using the trace name as an index, so as to obtain the device pin connected to the selected trace.

3. The method for setting the width of the trace on the printed circuit board as claimed in claim 1, wherein contents recorded by a code file are searched by using the device pin as an index, so as to acquire the pad corresponding to the device pin and read the width of the pad.

4. A method for setting a width of a trace on a printed circuit board, implemented by a computer layout software through using a computer, for correcting the width of the trace on the printed circuit board, the method for setting the width of the trace on the printed circuit board comprising:
   (a) opening a nets file;
   (b) selecting one trace from a plurality of traces when the nets file records several traces;
   (c) obtaining a trace name of the selected trace;
   (d) selecting at least one device pin connected to the selected trace by using the trace name as an index;
   (e) acquiring a pad corresponding to the device pin from contents recorded by a code file, wherein the device pin is set on the pad;
   (f) obtaining the width of the pad using the computer;
   (g) determining whether the width of the selected trace is greater than that of the pad; and (h) changing the width of the selected trace to be the same as that of the pad when the width of the selected trace is greater than that of the pad.

5. The method for setting the width of the trace on the printed circuit board as claimed in claim 4, further comprising:
checking whether there is some other device pin connected to the selected trace;
selecting the other device pin and repeating the steps (e)-(h) to change the width of each segment of the trace when there is some other device pin, so that the width of each segment of the trace is the same as that of the corresponding pad.

6. The method for setting the width of the trace on the printed circuit board as claimed in claim 4, further comprising:
checking whether there is some other unselected trace in the nets file;
selecting the other unselected trace and repeating the steps (e)-(h) when there is some other unselected trace, so that the width of the other trace is the same as that of the corresponding pad.

7. The method for setting the width of the trace on the printed circuit board as claimed in claim 4, wherein, in the step (d), the nets file is searched by using the trace name as an index, so as to select the device pin connected to the selected trace.

8. The method for setting the width of the trace on the printed circuit board as claimed in claim 4, wherein, in the step (f), the contents recorded by the code file are read by using a name of the pad as an index, so as to obtain the width of the pad.

* * * * *